United States Patent
Hung et al.

(10) Patent No.: US 8,665,646 B2
(45) Date of Patent: Mar. 4, 2014

(54) METHOD AND APPARATUS FOR INDICATING BAD MEMORY AREAS

(75) Inventors: Shuo-Nan Hung, Jhubei (TW); Ti Wen Chen, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 91 days.

(21) Appl. No.: 13/289,944

(22) Filed: Nov. 4, 2011

(65) Prior Publication Data

US 2013/0114341 A1    May 9, 2013

(51) Int. Cl.
*G11C 16/04* (2006.01)
(52) U.S. Cl.
USPC ............. 365/185.17; 365/185.18; 365/185.21
(58) Field of Classification Search
USPC ............. 365/185.17, 185.18, 185.21, 185.23, 365/186.09
See application file for complete search history.

(56) References Cited

U.S. PATENT DOCUMENTS

| | | | | |
|---|---|---|---|---|
| 6,826,081 | B2* | 11/2004 | Nagashima et al. | 365/185.09 |
| 7,742,338 | B2* | 6/2010 | Santin et al. | 365/185.18 |
| 8,031,530 | B2* | 10/2011 | Joo | 365/185.25 |
| 8,411,503 | B2* | 4/2013 | Lee | 365/185.03 |

* cited by examiner

*Primary Examiner* — David Lam
(74) *Attorney, Agent, or Firm* — Kenta Suzue; Haynes Beffel & Wolfeld LLP

(57) ABSTRACT

Regardless of data values stored on data memory cells, all read operations on the data memory cells are disallowed. For example, current flow is disallowed through a string of the data memory cells and one or more select line memory cells. The particular select value stored in a first select line memory cell in the string, for example coupled to a ground select line or a string select line, determines whether the string is enabled or disabled.

25 Claims, 9 Drawing Sheets

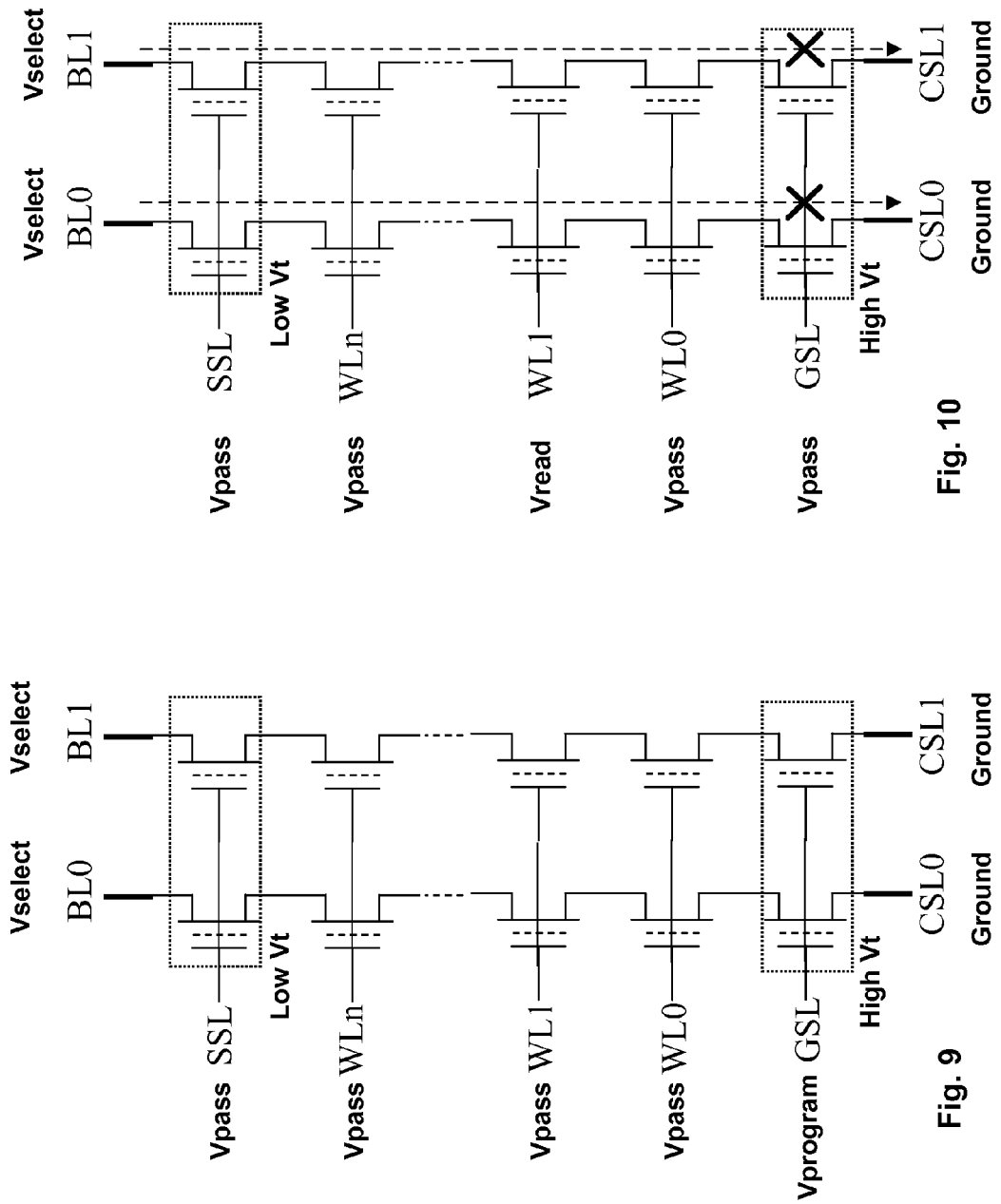

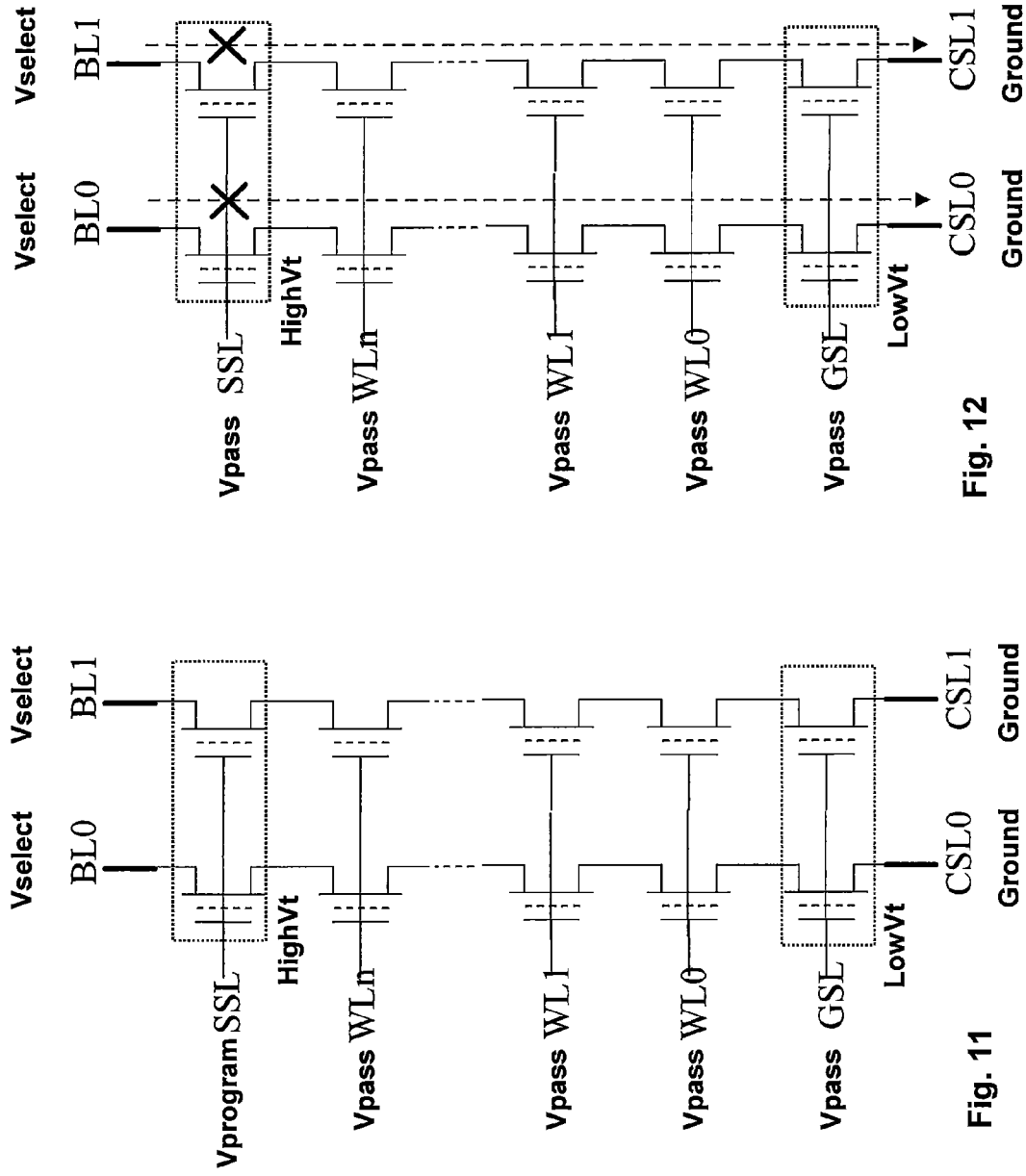

METHOD AND APPARATUS FOR INDICATING BAD MEMORY AREAS

BACKGROUND

1. Field of the Invention

This technology relates to indicating bad memory areas, such as bad memory blocks.

2. Description of Related Art

Present approaches to store bad block information require extra memory cells that consume extra area on an integrated circuit, or fuses that also consume extra area on an integrated circuit.

SUMMARY

One aspect of the technology is an integrated circuit apparatus, comprising a plurality of memory cells, a plurality of word lines, and a first select line.

The plurality of memory cells are arranged between a first end and a second end of a string. The string includes data memory cells and one or more select line memory cells. In one embodiment, the first end of the string is electrically connected to a bit line and the second end of the string is electrically connected to a common source line. In another embodiment, one or both ends of the string is a virtual ground. The virtual ground is positioned at an intermediate node of a series of connected memory cells. When the virtual ground is set to ground, for example, the virtual ground divides the series of connected memory cells into different strings on either side of the virtual ground node.

The plurality of word lines are between the first end and the second end of the string. Word lines in the plurality are coupled to corresponding data memory cells in the string. The data memory cells store data accessed by a read operation.

The first select line is coupled to a first select line memory cell in the string. The first select line is between the first end and the second end of the string. In one embodiment, the first select line is between the plurality of word lines and one of the first end and the second end of the string. In one embodiment, the first select line is one of a ground select line and a string select line. In this case the select line memory cell is a transistor coupled to the ground select line or a transistor coupled to the string select line.

The control circuitry applies a bias arrangement that stores a first select value in the first select line memory cell. The first select value disallows all read operations on the data memory cells. This can disallow current flow through the string, regardless of data values stored on the data memory cells. For example, current flow through the string is disallowed in a read operation, regardless of any data value stored by the memory cell selected for reading.

In contrast, in a typical read operation, current flows through the string depending on the data value and corresponding threshold voltage range stored on the data memory cell in the string undergoing a read operation.

In some embodiments the string is a NAND string.

In one embodiment, the first select value in the first select line memory cell indicates that the string of the memory cells is a bad memory area. In one embodiment, the first select value in the first select line memory cell corresponds to a first threshold voltage range—such as high threshold voltage Vt—in the first select line memory cell that prevents current from flowing through the first select line memory cell, despite the control circuitry applying a pass voltage of a read bias arrangement to the first select line. However, the pass voltage is sufficient to allow current to flow for other select values in the first select line memory cell, such as a second select corresponding to a low threshold voltage Vt.

The first select line memory cell can store the second select value, for example corresponding to a low threshold voltage Vt. In one embodiment, responsive to the first select line memory cell storing the second select value different from the first select value, current is allowed to flow through the first select line memory cell, when the control circuitry performs the read operation on a selected one of the data memory cells by applying a read bias arrangement. In one embodiment, the read bias arrangement includes a read voltage to a selected word line coupled to the selected one of the data memory cells, and a pass voltage to the first select line and to other word lines coupled to unselected ones of the data memory cells. In one embodiment, the first select value corresponds to a first threshold voltage range (such as high threshold voltage Vt) in the first select line memory cell that prevents current from flowing through the first select line memory cell responsive to the control circuitry applying a pass voltage of the read bias arrangement to the first select line, and the second select value corresponds to a second threshold voltage range (such as low threshold voltage Vt) in the first select line memory cell that allows current to flow through the first select line memory cell responsive to the control circuitry applying the pass voltage of the read bias arrangement to the first select line.

One embodiment further comprises a second select line. For example, the first and second select lines are the ground select line and the string select line. In one embodiment, the second select line is between the first end and the second end of the string. The second select line is coupled to a second select line memory cell of the one or more select line memory cells, and the second select line memory cell selectively stores the first select value that disallows all read operations on the data memory cells from causing current flow through the string.

Another aspect of the technology is a method, comprising:
regardless of data values stored on data memory cells, disallowing all read operations on a string of the data memory cells and one or more select line memory cells, by storing a first select value in a first select line memory cell in the string, wherein the data memory cells are accessed by a plurality of word lines between a first end and a second end of the string and the first select line memory cell is accessed by a first select line between the first end and the second end of the string.

Other embodiments are described herein.

BRIEF DESCRIPTION OF THE DRAWINGS

FIG. 9 is a circuit diagram showing that a select memory cell coupled to a ground select line is programmed to disable a memory area.

FIG. 10 is a circuit diagram showing that a select memory cell coupled to a ground select line, shown in FIG. 9, disables a memory area disallows a read operation.

FIG. 11 is a circuit diagram showing that a select memory cell coupled to a string select line is programmed to disable a memory area.

FIG. 12 is a circuit diagram showing that a select memory cell coupled to a string select line, shown in FIG. 11, disables a memory area and disallows a read operation.

DETAILED DESCRIPTION

Figure 1:
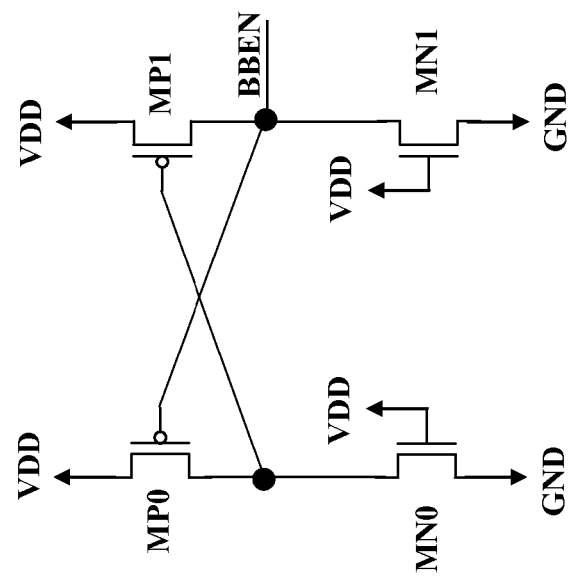
FIG. 1 is an example of a transistor having a threshold voltage that indicates whether a particular part of a memory array is bad, with a bad block enable signal.

FIG. 1 is an example of a transistor having a threshold voltage that indicates whether a particular part of a memory array is bad, with a bad block enable signal.

The p-type transistor MP0 and n-type transistor MN0 are in series between supply voltage VDD and ground GND. The p-type transistor MP1 and n-type transistor MN1 are in series between supply voltage VDD and ground GND.

The shared node coupled to the drain terminals of p-type transistor MP0 and n-type transistor MN0 is coupled to the gate of p-type transistor MP1. The shared node coupled to the drain terminals of p-type transistor MP1 and n-type transistor MN1 is coupled to the gate of p-type transistor MP0, and outputs the bad block enable signal BBEN. The gates of n-type transistors MN0 and MN1 are coupled to the supply voltage VDD.

When n-type transistor MN0 stores a high threshold voltage Vt, then bad block enable signal BBEN is GND. When n-type transistor MN1 stores a high threshold voltage Vt, then bad block enable signal BBEN is VDD.

The example in FIG. 1 consumes the chip area required by the extra transistors as shown, for each memory area that requires a BBEN signal.

Figure 2:
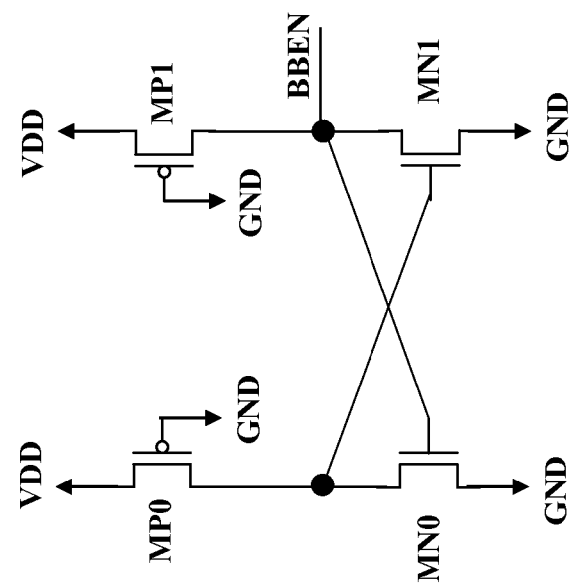
FIG. 2 is another example of a transistor having a threshold voltage that indicates whether a particular part of a memory array is bad, with a bad block enable signal.

FIG. 2 is another example of a transistor having a threshold voltage that indicates whether a particular part of a memory array is bad, with a bad block enable signal.

The p-type transistor MP0 and n-type transistor MN0 are in series between supply voltage VDD and ground GND. The p-type transistor MP1 and n-type transistor MN1 are in series between supply voltage VDD and ground GND.

The shared node coupled to the drain terminals of p-type transistor MP0 and n-type transistor MN0 is coupled to the gate of n-type transistor MN1. The shared node coupled to the drain terminals of p-type transistor MP1 and n-type transistor MN1 is coupled to the gate of n-type transistor MN0, and outputs the bad block enable signal BBEN. The gates of p-type transistors MP0 and MP1 are coupled to the ground GND.

When p-type transistor MP0 stores a high threshold voltage Vt, then bad block enable signal BBEN is VDD. When p-type transistor MP1 stores a high threshold voltage Vt, then bad block enable signal BBEN is GND.

The example in FIG. 2 also consumes the chip area required by the extra transistors as shown, for each memory area that requires a BBEN signal.

Figure 3:
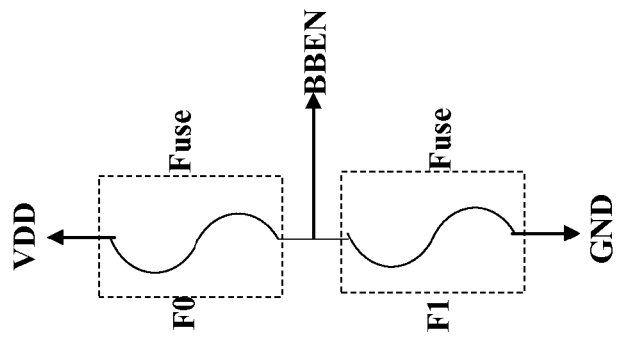
FIG. 3 is an example of a fuse structure having that indicates whether a particular part of a memory array is bad, with a bad block enable signal.

FIG. 3 is an example of a fuse structure having that indicates whether a particular part of a memory array is bad, with a bad block enable signal.

Fuses F0 and F1 are in series between supply voltage VDD and ground GND. The node between the fuses F0 and F1 outputs the bad block enable signal BBEN. The fuse can be polysilicon or metal material. If fuse F0 is cut, for example by a laser, the bad block enable signal BBEN is ground GND. If fuse F1 is cut, for example by a laser, the bad block enable signal BBEN is the supply voltage VDD.

The example in FIG. 3 also consumes the chip area required by the extra fuses as shown, for each memory area that requires a BBEN bad block enable signal.

Figure 4:
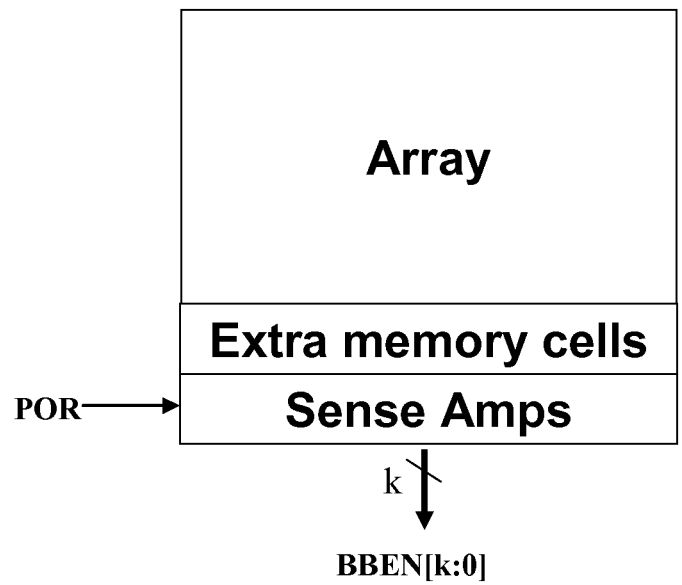
FIG. 4 is a block diagram of a memory array with extra memory cells that indicate, upon power on or reset, whether particular parts of a memory array are bad, with multiple bad block enable signals.
Figure 5:
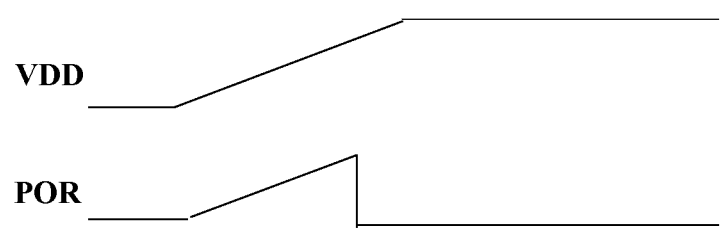
FIG. 5 is a timing diagram of supply voltage and the power on reset signal for the memory array of FIG. 4.

FIG. 4 is a block diagram of a memory array with extra memory cells that indicate, upon power on or reset, whether particular parts of a memory array are bad, with multiple bad block enable signals. FIG. 5 is a timing diagram of supply voltage and the power on reset signal for the memory array of FIG. 4.

When the integrated circuit powers on, the supply voltage VDD ramps up from 0 V to VDD. The POR power on reset signal ramps up from 0 V to an intermediate value, and then activates the POR power on reset signal. The POR power on reset signal is received by the memory array, and activates the extra memory cells that store bad block data. Also activated is sense amplifier circuitry to output the BBEN bad block enable signal. The BBEN[k:0] bad block enable signal is multiple bits wide, to indicate the bad block status of multiple memory blocks.

Figure 6:
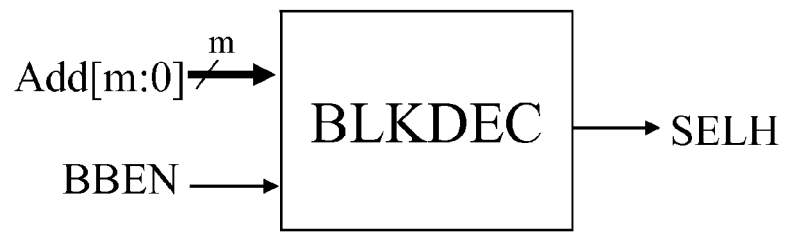
FIG. 6 is a block diagram of a block decoder that processes an address signal and a bad block enable signal, to generate a select signal that enables a memory area.

FIG. 6 is a block diagram of a block decoder that processes an address signal and a bad block enable signal, to generate a select signal that enables a memory area.

A bad block enable signal BBEN and address signal Add [m:0] is received by the block decoder BLKDEC. The block decoder BLKDEC output the SELH signal to enable or disable a memory area such as a block.

Figure 7:
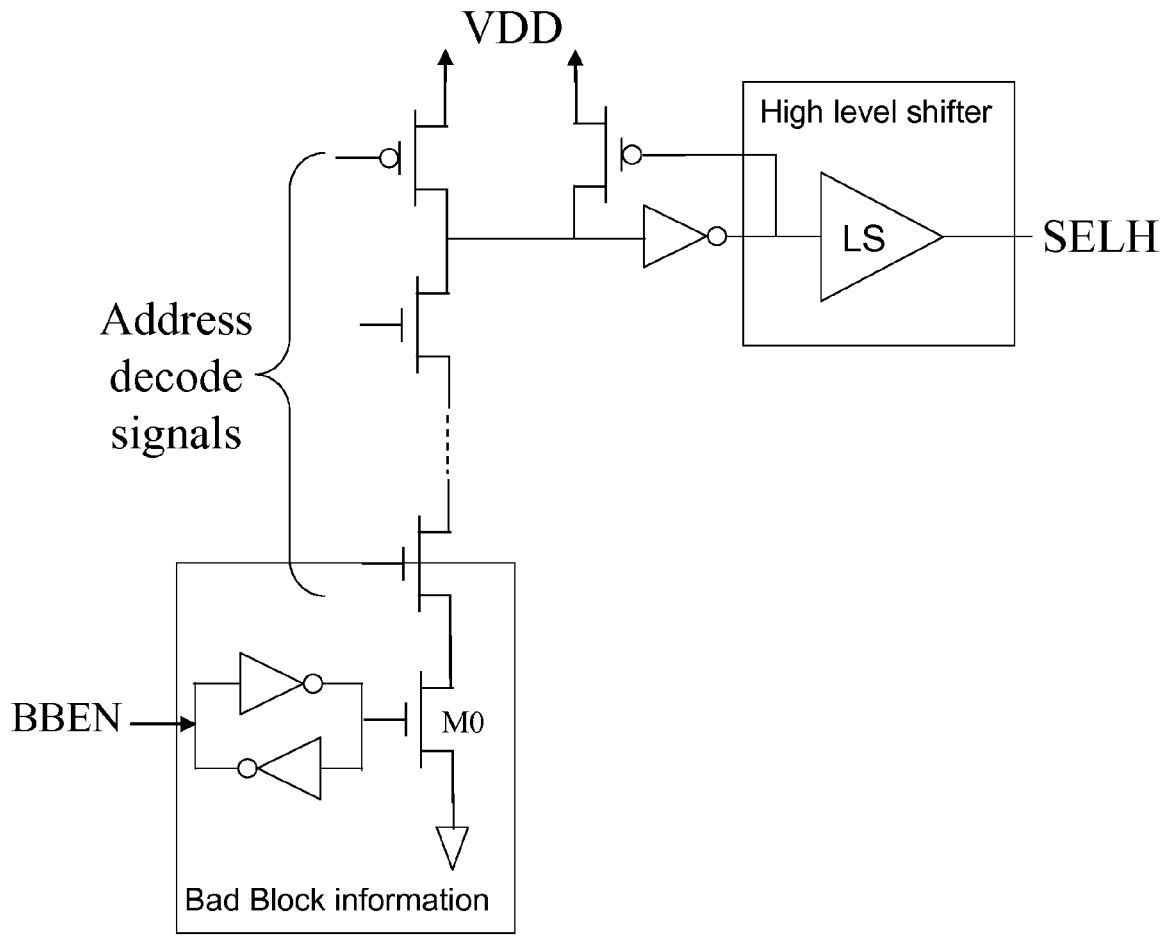
FIG. 7 is a more detailed block diagram of a block decoder that processes an address signal and a bad block enable signal, to generate a select signal that enables a memory area.

FIG. 7 is a more detailed block diagram of a block decoder, such as the block decoder of FIG. 6, that processes an address signal and a bad block enable signal, to generate a select signal that enables a memory area.

A memory element, such as two inverters connected so that the input of one is connected to the output of the other, stores the incoming bad block enable signal BBEN. The output of the memory element is connected to the gate of n-type transistor M0. The n-type transistor M0 is connected in series with other transistors that receive address decode signals.

The n-type transistor M0 and the n-type address decode transistors are in series with p-type transistors coupled to supply voltage VDD. When bad block enable signal BBEN is high, n-type transistor M0 turns off, and the series of n-type transistors will not couple to ground regardless of the address decode results. The node between the p-type pull up transistors, which remains high at the supply voltage VDD, is coupled to an inverter input. The inverter output is low, and is provided to the input of a level shifter. The output of the level shifter SELH stays low, providing low gate voltage such that pass transistors remain off that would otherwise pass signals such as SSL, WL, and GSL to the memory array.

When bad block enable signal BBEN is low, n-type transistor M0 turns on, and the series of n-type transistors turn on depending the address decode results. With matching address decode signals, the node between the p-type pull up transistors, which is pulled down to ground, is coupled to an inverter input. The inverter output is high, and is provided to the input of a level shifter. The output of the level shifter SELH is high, providing sufficient gate voltage to turn on pass transistors that pass signals such as SSL, WL, and GSL to the memory array.

Figure 8:
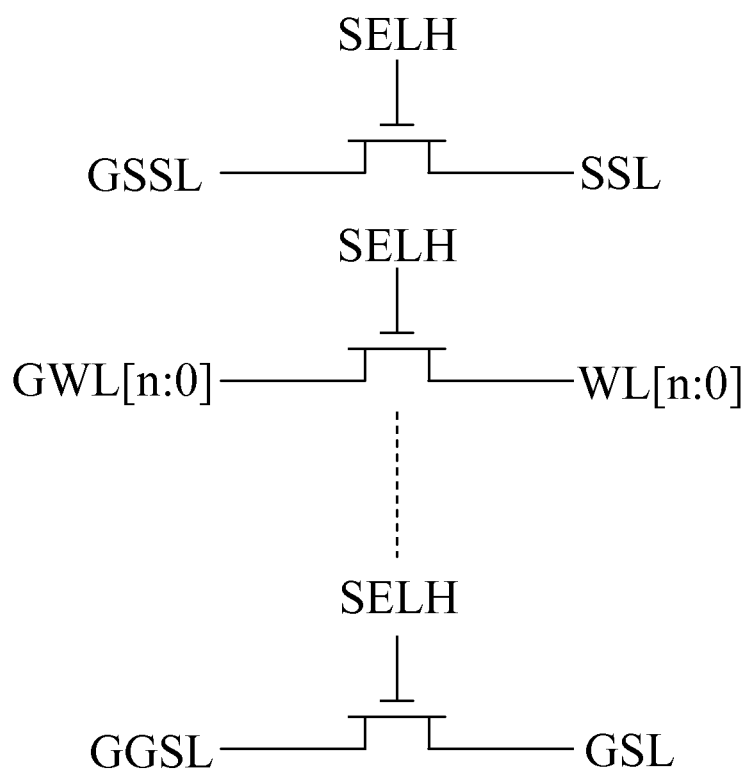
FIG. 8 is a circuit diagram showing that the select signal enables a memory area.

FIG. 8 is a circuit diagram showing that the select signal enables a memory area.

The output of the level shifter SELH is connected to pass transistors that pass signals such as SSL, WL, and GSL to the memory array. At the top of the figure, global string select line signal GSSL is coupled to a local string select line signal SSL by a pass transistor that is turned on by the output of the level shifter SELH. At the middle of the figure, global word line signals GWL[n:0] are coupled to a local word line signals WL[n:0] by pass transistors that are turned on by the output of the level shifter SELH. At the bottom of the figure, global ground select line signal GGSL is coupled to a local ground select line signal GSL by a pass transistor that is turned on by the output of the level shifter SELH.

FIG. 9 is a circuit diagram showing that a select memory cell coupled to a ground select line is programmed to disable a memory area.

Two NAND strings of memory cells are connected in series. The left NAND string is connected between bit line BL0 and common source line CSL0. The right NAND string is connected between bit line BL1 and common source line CSL1. The memory cells are accessed by word lines WL0, WL1, ... WLn. String select line transistors connect the top end of the left NAND string to bit line BL0, and the top of the right NAND string to bit line BL1. Ground select line transistors connect the bottom end of the left NAND string to common source line CSL0, and the bottom end of the right NAND string to common source line CSL1.

String select line SSL and word lines WL0, WL1, ... WLn receive a pass voltage. Ground select line GSL receives a program voltage. The ground select line transistors are programmed to a high threshold voltage Vt, for example by FN programming. The string select line transistors are not programmed and remain at low threshold voltage Vt.

In various embodiments, all NAND strings in a block are programmed as shown, multiple selected NAND strings are programmed as shown, or a single selected NAND strings is programmed as shown.

FIG. 10 is a circuit diagram showing that a select memory cell coupled to a ground select line, shown in FIG. 9, disables a memory area disallows a read operation.

A selected word line WL1, coupled to selected transistors for a read operation, receives a read voltage. The ground select line GSL, string select line SSL, and other unselected word lines WL0, WL2, ... WLn receive a pass voltage. The high threshold voltage Vt which was programmed to the ground select line transistors causes the ground select line transistors to remain off when the ground select line GSL receives a pass voltage. The other transistors receiving the pass voltage are on. The NAND string fails to conduct current, regardless of the data value stored on the transistors coupled to word line WL1.

In various embodiments, all NAND strings in a block are read as shown, multiple selected NAND strings are read as shown, or a single selected NAND strings is read as shown.

FIG. 11 is a circuit diagram showing that a select memory cell coupled to a string select line is programmed to disable a memory area.

The NAND strings of memory cells are connected as in FIG. 9. Ground select line GSL and word lines WL0, WL1, ... WLn receive a pass voltage. String select line SSL receives a program voltage. The string select line transistors are programmed to a high threshold voltage Vt, for example by FN programming. The ground select line transistors are not programmed and remain at low threshold voltage Vt.

In various embodiments, all NAND strings in a block are programmed as shown, multiple selected NAND strings are programmed as shown, or a single selected NAND strings is programmed as shown.

FIG. 12 is a circuit diagram showing that a select memory cell coupled to a string select line, shown in FIG. 11, disables a memory area and disallows a read operation.

A selected word line WL1, coupled to selected transistors for a read operation, receives a read voltage. The ground select line GSL, string select line SSL, and other unselected word lines WL0, WL2, ... WLn receive a pass voltage. The high threshold voltage Vt which was programmed to the string select line transistors causes the string select line transistors to remain off when the string select line SSL receives a pass voltage. The other transistors receiving the pass voltage are on. The NAND string fails to conduct current, regardless of the data value stored on the transistors coupled to word line WL1.

In various embodiments, all NAND strings in a block are read as shown, multiple selected NAND strings are read as shown, or a single selected NAND strings is read as shown.

Figures 13, 14:
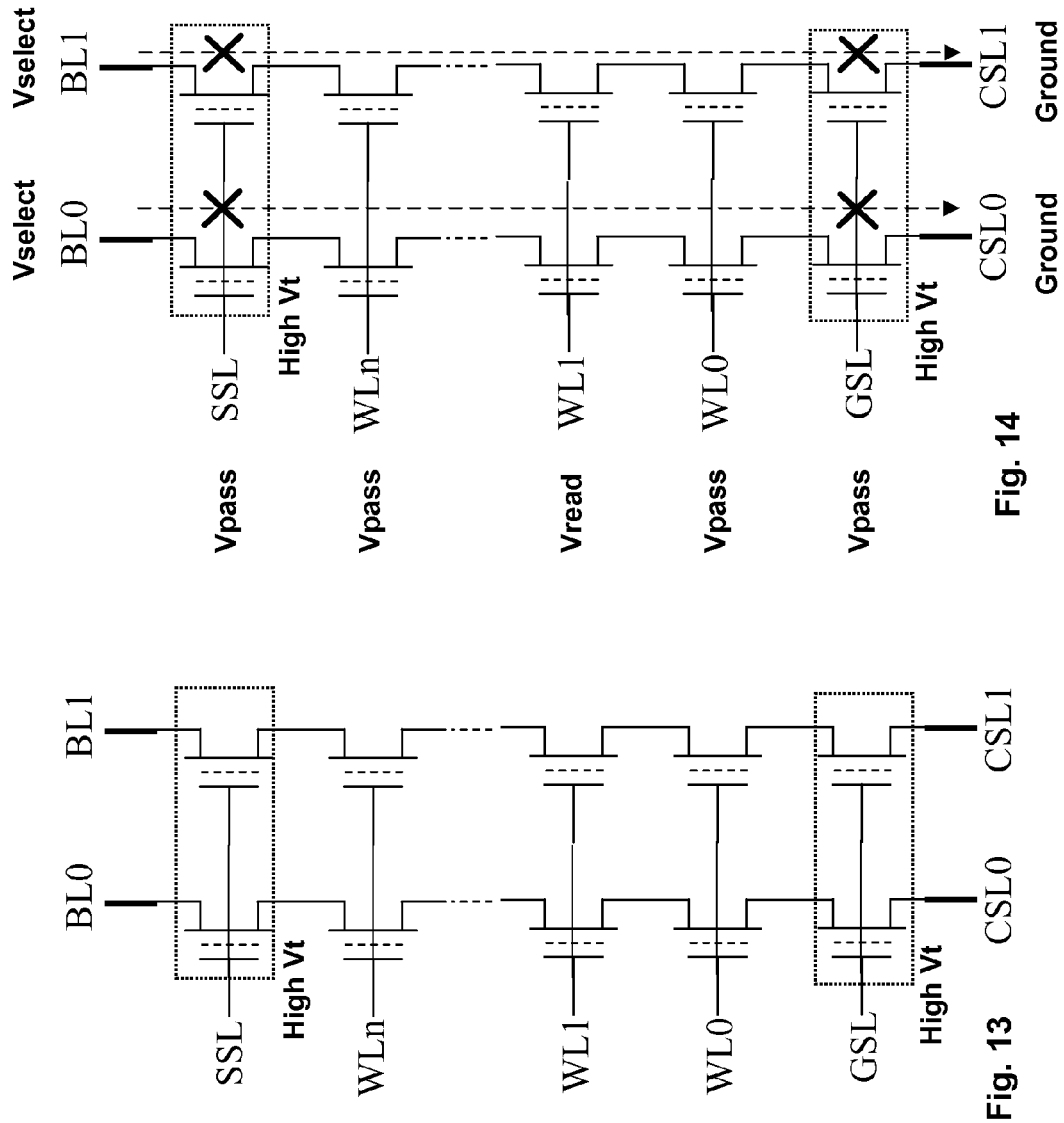
FIG. 13 is a circuit diagram showing that select memory cells coupled to a string select line and a ground select line are programmed to disable a memory area.
FIG. 14 is a circuit diagram showing that select memory cells coupled to a string select line and a ground select line, shown in FIG. 13, disable a memory area and disallow a read operation.

FIG. 13 is a circuit diagram showing that select memory cells coupled to a string select line and a ground select line are programmed to disable a memory area.

The NAND strings of memory cells are connected as in FIG. 9. Both the string select line transistors and the ground select line transistors are programmed to a high threshold voltage Vt, for example by FN programming. For example, programming as shown in FIG. 9 is followed by programming as shown in FIG. 11, or programming as shown in FIG. 11 is followed by programming as shown in FIG. 9.

In various embodiments, all NAND strings in a block are programmed as shown, multiple selected NAND strings are programmed as shown, or a single selected NAND strings is programmed as shown.

FIG. 14 is a circuit diagram showing that select memory cells coupled to a string select line and a ground select line, shown in FIG. 13, disable a memory area and disallow a read operation.

A selected word line WL1, coupled to selected transistors for a read operation, receives a read voltage. The ground select line GSL, string select line SSL, and other unselected word lines WL0, WL2, ... WLn receive a pass voltage. The high threshold voltage Vt which was programmed to the string select line transistors causes the string select line transistors to remain off when the string select line SSL receives a pass voltage. The high threshold voltage Vt which was programmed to the ground select line transistors causes the ground select line transistors to remain off when the ground select line GSL receives a pass voltage. The other transistors receiving the pass voltage are on. The NAND string fails to conduct current, regardless of the data value stored on the transistors coupled to word line WL1.

In various embodiments, all NAND strings in a block are read as shown, multiple selected NAND strings are read as shown, or a single selected NAND strings is read as shown.

Figures 15, 16:
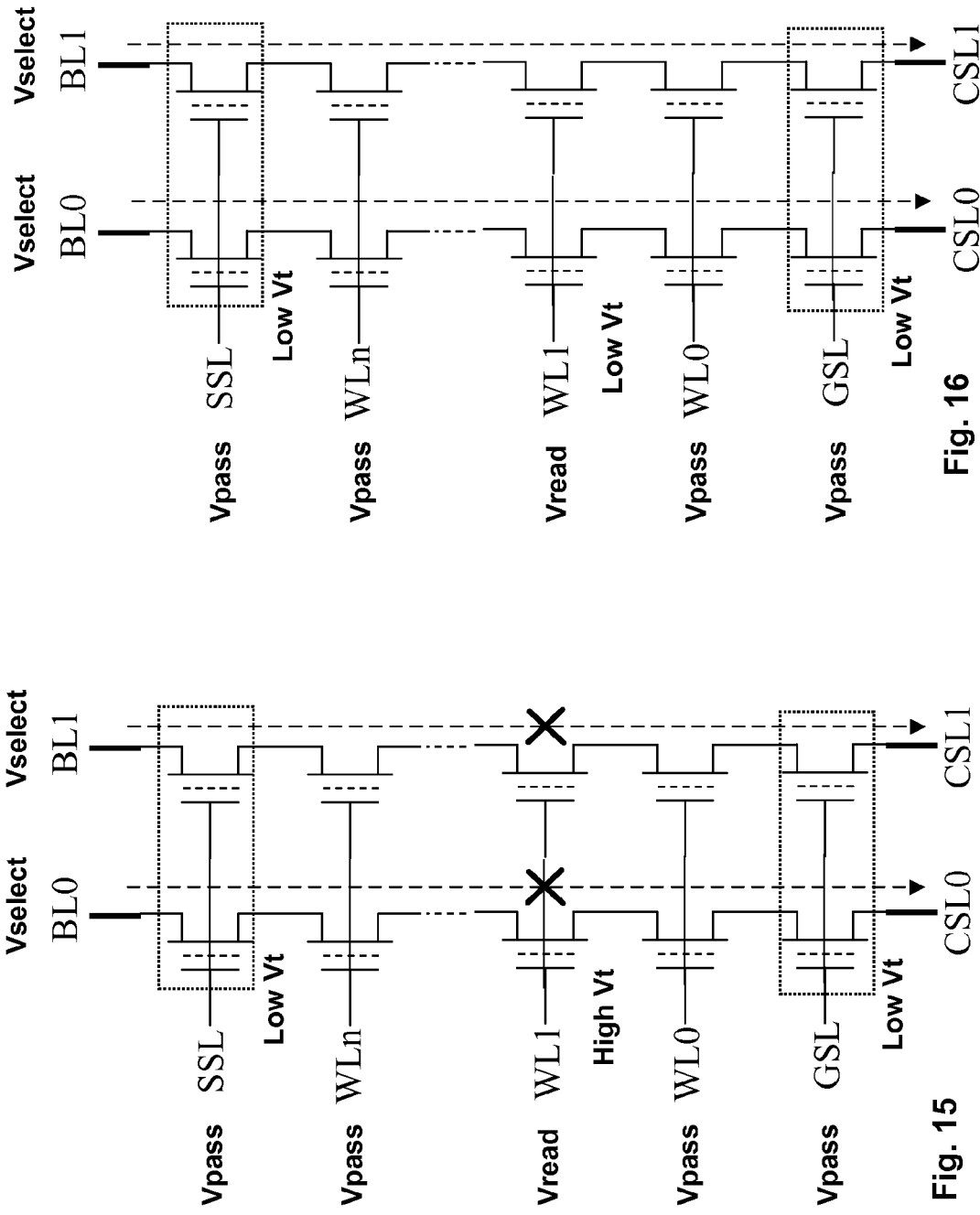
FIG. 15 is a circuit diagram showing that select memory cells coupled to a string select line and a ground select line enable a memory area, and allow a read operation to be performed on a data memory cell storing a high threshold voltage.
FIG. 16 is a circuit diagram showing that select memory cells coupled to a string select line and a ground select line enable a memory area, and allow a read operation to be performed on a data memory cell storing a low threshold voltage.

FIG. 15 is a circuit diagram showing that select memory cells coupled to a string select line and a ground select line enable a memory area, and allow a read operation to be performed on a data memory cell storing a high threshold voltage.

A selected word line WL1, coupled to selected transistors for a read operation, receives a read voltage. The ground select line GSL, string select line SSL, and other unselected word lines WL0, WL2, . . . WLn receive a pass voltage. The transistors receiving the pass voltage are on. The NAND string fails to conduct current, because the data value stored on the transistors coupled to word line WL1 are associated with a high threshold voltage Vt. In other embodiments, only some or one of the transistors coupled to word line WL1 are associated with a high threshold voltage Vt.

In various embodiments, all NAND strings in a block are read as shown, multiple selected NAND strings are read as shown, or a single selected NAND strings is read as shown.

FIG. 16 is a circuit diagram showing that select memory cells coupled to a string select line and a ground select line enable a memory area, and allow a read operation to be performed on a data memory cell storing a low threshold voltage.

A selected word line WL1, coupled to selected transistors for a read operation, receives a read voltage. The ground select line GSL, string select line SSL, and other unselected word lines WL0, WL2, . . . WLn receive a pass voltage. The transistors receiving the pass voltage are on. The NAND string conduct current, because the data value stored on the transistors coupled to word line WL1 are associated with a low threshold voltage Vt. In other embodiments, only some or one of the transistors coupled to word line WL1 are associated with a low threshold voltage Vt.

In various embodiments, all NAND strings in a block are read as shown, multiple selected NAND strings are read as shown, or a single selected NAND strings is read as shown.

Figure 17:
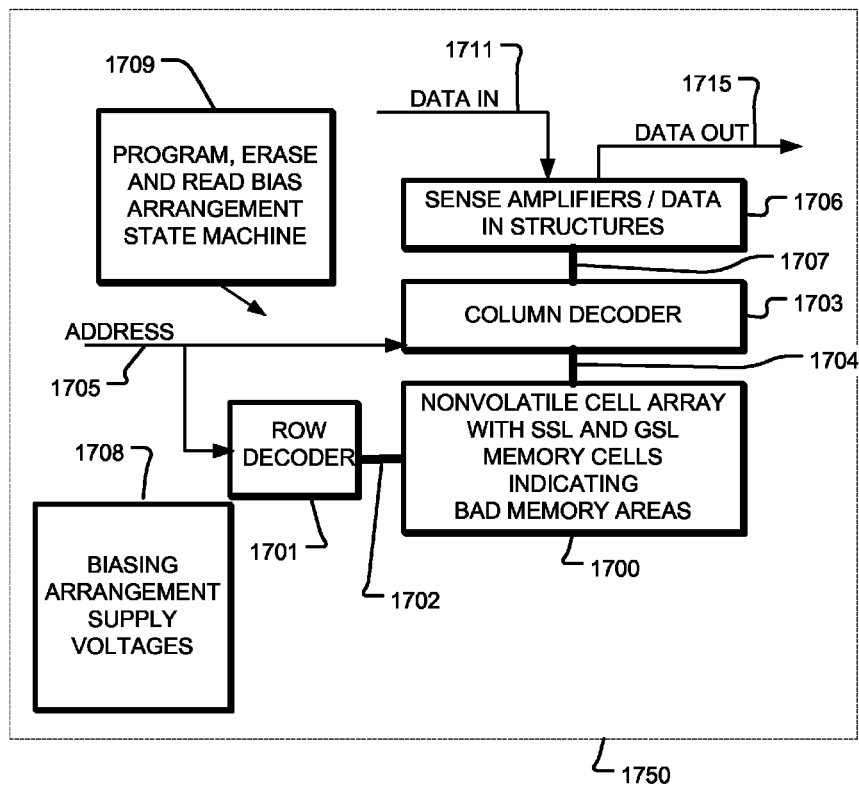
FIG. 17 is a block diagram of an integrated circuit with a memory array that indicates bad memory areas using memory cells accessed by SSL and/or GSL lines.

FIG. 17 is a block diagram of an integrated circuit with a memory array that indicates bad memory areas using memory cells accessed by SSL and/or GSL lines.

An integrated circuit 1750 includes a memory array 1700. A word line decoder 1701 is coupled to and in electrical communication with a plurality of word lines 1702 arranged along rows in the memory array 1700. A bit line (column) decoder 1703 is in electrical communication with a plurality of bit lines 1704 arranged along columns in the array 1700. Addresses are supplied on bus 1705 to the word line decoder 1701 and bit line decoder 1703. In some embodiments the decoding circuitry for a memory block selects a GSL and/or SSL cell and one or more of the WL cells. Sense circuitry (sense amplifiers) and data-in structures in block 1706, including voltage and/or current sources are coupled to bit line decoder 1703 via data bus 1707. Data is supplied via a data-in line 1711 from input/output ports on integrated circuit 1750, or from other data sources internal or external to integrated circuit 1750, to data-in structures in block 1706. Other circuitry may be included on integrated circuit 1750, such as a general purpose processor or special purpose application circuitry, or a combination of modules providing system-on-a-chip functionality supported by array 1700. Data is supplied via a data-out line 1715 from the sense amplifiers in block 1706 to input/output ports on integrated circuit 1750, or to other data destinations internal or external to integrated circuit 1750.

A controller 1709 implemented in this example, using a bias arrangement state machine, controls the data stored in the memory cells accessed by SSL and GSL transistors, bias circuitry voltage and current sources 1708 for the application of bias arrangements including read, program, erase, erase verify and program verify voltages and/or currents for the word lines and bit lines. Controller 1709 may be implemented using special-purpose logic circuitry as known in the art. In alternative embodiments, controller 1709 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1709.

In some embodiments, the GSL and SSL cells replace a bad block table.

Example memory cells are floating gate memory cells. Another type of memory cell can be referred to as a charge trapping memory cell, which uses a dielectric charge trapping layer in place of the floating gate.

An example memory cell consists of a field effect transistor FET structure having a source and drain separated by a channel, and a gate separated from the channel by a charge storage structure including a tunnel dielectric layer, the charge storage layer (floating gate or dielectric), and a blocking dielectric layer. According to the charge trapping memory designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed of silicon oxide (O), and the gate comprises polysilicon (S).

Data is stored in a memory device by controlling the amount of charge trapped in the charge storage structure. The amount of charge stored sets a threshold voltage for the memory cell in memory devices, which allows the data to be read. An example programming mechanism is Fowler-Nordheim programming.

In some embodiments the structure of the GSL and SSL cells is the same as the WL cells. In other embodiments the structure of the GSL and SSL cells is different from the WL cells. In yet other embodiments the structure of the GSL and SSL cells vary from the structure of the WL cells in that the transistor width and/or length are different.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit apparatus, comprising:
   a plurality of memory cells arranged between a first end and a second end of a string, the string including data memory cells and one or more select line memory cells;
   a plurality of word lines between the first end and the second end of the string, word lines in the plurality coupled to corresponding data memory cells in the string; and a first select line between the first end and the second end of the string, the first select line coupled to a first select line memory cell in the string; and a first select value stored in the first select line memory cell that disallows all read operations on the data memory cells.

2. The apparatus of claim 1, wherein the first select value in the first select line memory cell indicates that the string of the memory cells is a bad memory area.

3. The apparatus of claim 1, wherein the first select line is one of a ground select line and a string select line.

4. The apparatus of claim 1, wherein the first end of the string is electrically connected to a bit line and the second end of the string is electrically connected to a common source line.

5. The apparatus of claim 1, wherein the first select line is between the plurality of word lines and one of the first end and the second end of the string.

6. The apparatus of claim 1, wherein the first select value in the first select line memory cell corresponds to a first threshold voltage range in the first select line memory cell that prevents current from flowing through the first select line memory cell, despite control circuitry applying a pass voltage of a read bias arrangement to the first select line.

7. The apparatus of claim 1, wherein control circuitry performs the read operation on a selected one of the data memory cells by applying a read bias arrangement allowing current to flow through the first select line memory cell, responsive to the first select line memory cell storing a second select value different from the first select value.

8. The apparatus of claim 1, wherein control circuitry performs the read operation on a selected one of the data memory cells by applying a read bias arrangement allowing current to flow through the first select line memory cell, responsive to the first select line memory cell storing a second select value different from the first select value, the first select value corresponding to a first threshold voltage range in the first select line memory cell that prevents current from flowing through the first select line memory cell responsive to the control circuitry applying a pass voltage of the read bias arrangement to the first select line, and the second select value corresponding to a second threshold voltage range in the first select line memory cell that allows current to flow through the first select line memory cell responsive to the control circuitry applying the pass voltage of the read bias arrangement to the first select line.

9. The apparatus of claim 1, wherein control circuitry performs the read operation on a selected one of the data memory cells by applying a read bias arrangement including a read voltage to a selected word line coupled to the selected one of the data memory cells, and a pass voltage to the first select line and to other word lines coupled to unselected ones of the data memory cells; and the first select value stored in the first select line memory cell disallows current flow through the string regardless of any data value stored by the selected one of the memory cells.

10. The apparatus of claim 1, further comprising a second select line.

11. The apparatus of claim 1, further comprising a second select line between the first end and the second end of the string, wherein the second select line is coupled to a second select line memory cell of the one or more select line memory cells, and the second select line memory cell selectively storing the first select value that disallows all read operations on the data memory cells from causing current flow through the string.

12. The apparatus of claim 1, wherein the first end of the string is electrically connected to a virtual ground.

13. A method, comprising:

regardless of data values stored on data memory cells, disallowing all read operations on a string of the data memory cells and one or more select line memory cells, by storing a first select value in a first select line memory cell in the string, wherein the data memory cells are accessed by a plurality of word lines between a first end and a second end of the string and the first select line memory cell is accessed by a first select line between the first end and the second end of the string.

14. The method of claim 13, wherein the first select value in the first select line memory cell indicates that the string of the memory cells is a bad memory area.

15. The method of claim 13, wherein the first end of the string is electrically connected to a bit line and the second end of the string is electrically connected to a common source line.

16. The method of claim 13, wherein the first select line is between the plurality of word lines and one of the first end and the second end of the string.

17. The method of claim 13, wherein the first select line is one of a ground select line and a string select line.

18. The method of claim 13, wherein the first select value in the first select line memory cell corresponds to a first threshold voltage range in the first select line memory cell that prevents current from flowing through the first select line memory cell, despite applying a pass voltage of a read bias arrangement to the first select line.

19. The method of claim 13, further comprising:

performs the read operation on a selected one of the data memory cells by applying a read bias arrangement allowing current to flow through the first select line memory cell, responsive to the first select line memory cell storing a second select value different from the first select value.

20. The method of claim 13, further comprising:

performing the read operation on a selected one of the data memory cells by applying a read bias arrangement allowing current to flow through the first select line memory cell, responsive to the first select line memory cell storing a second select value different from the first select value, the first select value corresponding to a first threshold voltage range in the first select line memory cell that prevents current from flowing through the first select line memory cell responsive to applying a pass voltage of the read bias arrangement to the first select line, and the second select value corresponding to a second threshold voltage range in the first select line memory cell that allows current to flow through the first select line memory cell responsive to applying the pass voltage of the read bias arrangement to the first select line.

21. The method of claim 13, further comprising:

performing the read operation on a selected one of the data memory cells by applying a read bias arrangement including a read voltage to a selected word line coupled to the selected one of the data memory cells, and a pass voltage to the first select line and to other word lines coupled to unselected ones of the data memory cells; and the first select value stored in the first select line memory cell disallows current flow through the string regardless of any data value stored by the selected one of the memory cells.

22. The method of claim 13, further comprising a second select line.

23. The method of claim 13, further comprising a second select line between the first end and the second end of the string, wherein the second select line is coupled to a second select line memory cell of the one or more select line memory cells, and the second select line memory cell selectively storing the first select value that disallows all read operations on the data memory cells from causing current flow through the string.

24. The method of claim 13, wherein the first end of the string is electrically connected to a virtual ground.

25. An integrated device, comprising:
a plurality of memory transistors arranged in a NAND string, the NAND string including data memory transistors and one or more select line memory transistors; and
at least one of the plurality of select line memory transistors remaining off during a read operation when the at least one of the plurality of memory transistors receives a pass voltage.

* * * * *